(12) United States Patent
Ahmed et al.

(10) Patent No.: US 9,484,949 B1
(45) Date of Patent: Nov. 1, 2016

(54) VARIABLE RUN LENGTH ENCODING OF A BIT STREAM

(71) Applicant: Oracle International Corporation, Redwood City, CA (US)

(72) Inventors: Sadar Ahmed, Santa Clara, CA (US); Robert P. Masleid, Monte Sereno, CA (US)

(73) Assignee: Oracle International Corporation, Redwood Shores, CA (US)

(*) Notice: Subject to any disclaimer, the term of this patent is extended or adjusted under 35 U.S.C. 154(b) by 25 days.

(21) Appl. No.: 14/682,227

(22) Filed: Apr. 9, 2015

(51) Int. Cl.
*H03M 5/14* (2006.01)
*H04L 25/49* (2006.01)

(52) U.S. Cl.
CPC .......... *H03M 5/145* (2013.01); *H04L 25/4908* (2013.01)

(58) Field of Classification Search
CPC ............... H04L 1/0042; H04L 1/0047; H04L 25/49–25/4915
See application file for complete search history.

(56) References Cited

U.S. PATENT DOCUMENTS

| | | | |
|---|---|---|---|
| 4,606,052 A | 8/1986 | Hirzel et al. | |
| 4,855,735 A | 8/1989 | Webb et al. | |
| 5,195,110 A | 3/1993 | Gorshe | |
| 5,781,133 A * | 7/1998 | Tsang | G06T 9/005 341/59 |
| 6,018,304 A * | 1/2000 | Bessios | H03M 7/46 341/58 |
| 7,002,492 B2 * | 2/2006 | Tsang | G11B 20/1426 341/58 |
| 7,307,554 B2 * | 12/2007 | Kojima | H03M 7/06 341/50 |
| 7,432,834 B1 * | 10/2008 | Cideciyan | G11B 20/1426 341/50 |
| 2007/0230648 A1 | 10/2007 | Gupta et al. | |

* cited by examiner

*Primary Examiner* — Howard Williams
(74) *Attorney, Agent, or Firm* — Meyertons, Hood, Kivlin, Kowert & Goetzel, P.C.

(57) ABSTRACT

An apparatus and method for encoding data are disclosed that may allow for variable run length encoding of data to be transmitted. An ordered stream of data bits is received from a logic circuit, and N sequential data bits of the stream are selected, where N is a positive integer. Of the N sequential data bits, M sequential data bits are selected, wherein M is a positive integer less than N. The M sequential data bits are then encoded to generate a code word that includes P data bits, wherein P is a positive integer greater than M and less than N. The code word is then concatenated with a subset of the N sequential data bits that excludes the M sequential data bits to form a transmission word. A transmit unit then sends the data bits of the transmission word in a serial fashion.

18 Claims, 8 Drawing Sheets

VARIABLE RUN LENGTH ENCODING OF A BIT STREAM

BACKGROUND

1. Technical Field

Embodiments described herein are related to the field of high-speed interface design, and more particularly to bit stream encoding techniques.

2. Description of the Related Art

Computing systems typically include a number of interconnected integrated circuits. In some cases, the integrated circuits may communicate through parallel interfaces, which simultaneously communicate multiple bits of data. In other cases, the integrated circuits may employ a serial interface, which sequentially communicates one bit of data at a time. In some cases, both parallel and serial interfaces, individual bits of communicated data may be differentially encoded.

In some cases, the integrated circuits or devices within a computing system may communicate over the serial or parallel interfaces using one of various communication protocols. Such protocols may allow for the transmission of messages between various components of the computing system in addition to the transmission of data. The transmitted messages may include reports of levels of activity, requests for specific modes of operation, and the like.

During operation a computing system, data to be transmitted may be encoded prior to transmission. In cases where a parallel interface is employed, such encoding may be employed to reduce an amount of switching noise. Alternatively, encoding may be used to produce a sufficient number of data transitions to allow clock and data recovery circuits to properly lock to a received data stream.

SUMMARY OF THE EMBODIMENTS

Various embodiments of an apparatus to encode a serial data are disclosed. Broadly speaking, a system and method are contemplated that includes a logic circuit, an encoder circuit, and a transmit unit. The encoder circuit may be configured to receive an ordered stream of data bits from the logic circuit and select N sequential data bits of the ordered stream of data bits, where N is a positive integer. The encoder circuit may then select M sequential data bits of the N sequential data bits, where M is a positive integer less than N. The M sequential data bits may then be encoded, by the encoder circuit, to produce an encoded code word. The encoded code word may include P data bits, where P is a positive integer greater than M and less than N. The encoder circuit may then concatenate the encoded code word with a proper subset of the N sequential data bits to form a transmission word, where the proper subset excludes the M sequential data bits. The transmit unit may then transmit the transmission data word in a serial fashion.

In one embodiment, the encoded code word includes a first data bit at a first bit location in the encoded code word and a second data bit a second bit location in the encoded code word. The second bit location is adjacent to the first bit location, and a first logic value of the first data bit is different from a second logic value of the second data bit. The encoded code word includes a third data bit at a third bit location in the encoded code word, where a third logic value of the third data bit is the same as the first logic value.

In another specific embodiment, the value of N is programmable. In another non-limiting embodiment, the transmit unit may be configured to determine a quality level of transmission of the transmission data word.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

A computing system may include one or more integrated circuits, such as, e.g., a central processing unit (CPU) and memories. Each one of the integrated circuits of the computing system may communicate through either a serial or parallel interface. In a parallel interface, multiple data bits are communicated simultaneously, while in a serial interface, data is communicated as a series of sequential single data bits. The data may be communicated in accordance to one of various communication protocols.

In the case of a serial interface, transitions from one data state to another in the transmitted stream are employed to recover timing information necessary to sample the signal stream. The process of recovering timing information is commonly referred to as Clock Data Recovery (CDR) and, in many cases, relies on naturally occurring randomness within the transmitted data to recover the timing information.

In some cases, however, the signal stream may include few transitions as a same data value is transmitted for a period of time. When this occurs, CDR may be difficult, which may result in a loss of data by the receiving unit, resulting in a failure of the communication link. Some computer systems employ an encoding scheme to increase the number of transitions in the signal stream, although such schemes may require an increase in the data overhead, i.e., additional data bits may be transmitted. The embodiments in the drawings and described herein may provide techniques for encoding a serial data stream with low overhead and providing sufficient transitions for CDR.

Figure 1:
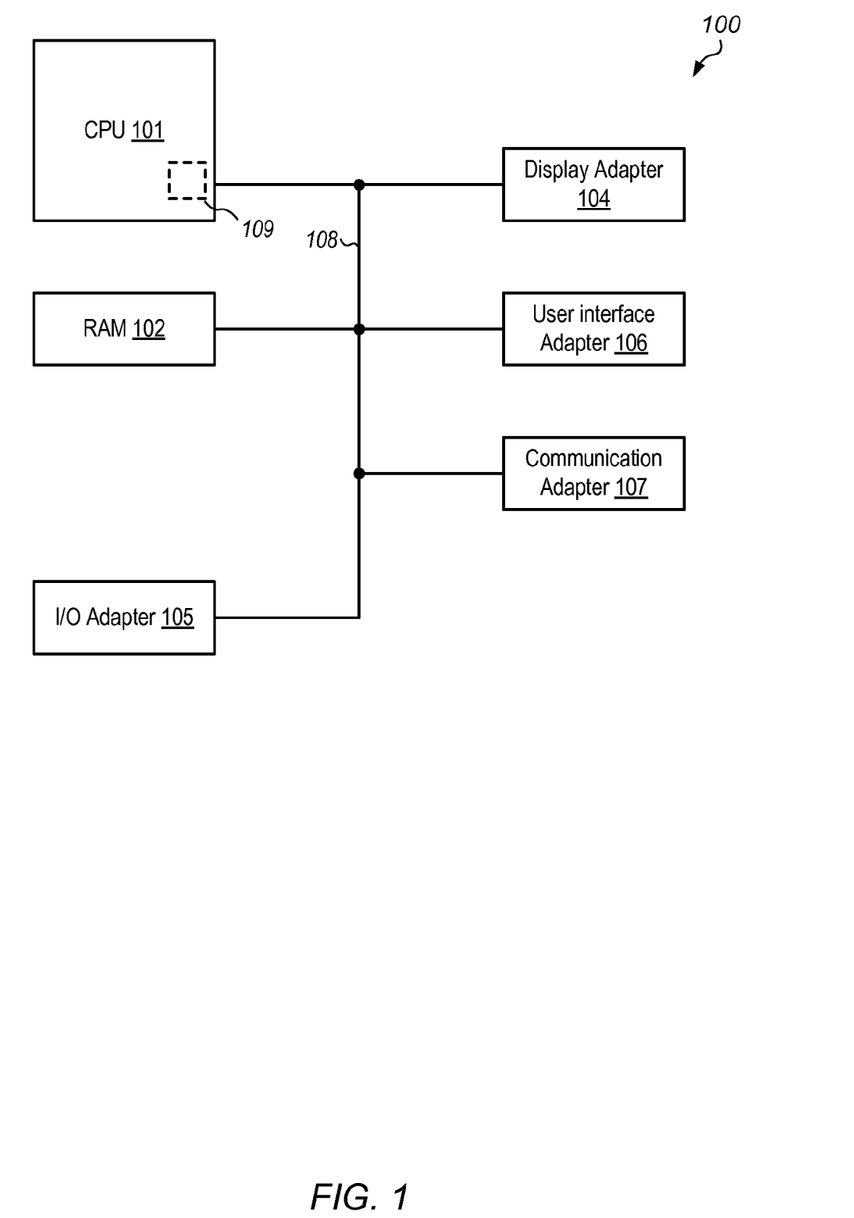
FIG. 1 illustrates an embodiment of a computing system.

A block diagram of a computing system is illustrated in FIG. 1. In the illustrated embodiment, the computing system 100 includes a CPU 101 coupled to Random Access Memory (RAM) 102, and display adapter 104. CPU 101 is additionally coupled to input/output (I/O) adapter 105, user interface adapter 106, and communications adapter 107. In various embodiments, computing system 100 may be configured as a desktop system, a laptop system, or in any suitable form factor.

RAM 102 may include any suitable type of memory, such as Fully Buffered Dual Inline Memory Module (FB-DIMM), Double Data Rate or Double Data Rate 2 Synchronous Dynamic Random Access Memory (DDR/DDR2 SDRAM), or Rambus® DRAM (RDRAM®), for example. It is noted that although one RAM is shown, in various embodiments, any suitable number of RAMs may be employed.

CPU 101 may implement any suitable instruction set architecture (ISA), such as, e.g., the SPARC™, PowerPC™, or x86 ISAs, or combination thereof. In some embodiments, CPU 101 may include one or more processor cores configured to implement one of the aforementioned ISAs. CPU 101 may also include one or more cache memories which may be configured to store instructions and/or data during operation.

CPU 101 may include one or more bus transceiver units 109 that allow CPU 101 to connect to bus 108. In some embodiments, bus 108 may be a high-speed serial interface that may conform to an industry standard specification, such as, e.g., PCI Express™, or MIPI Physical Layer. In some embodiments, transceiver unit 109 may include clock and data recover circuits in addition to encoder and decoder circuits.

I/O adapter 105 may be configured to coordinate data transfer between CPU 101 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O adapter 105 may be configured to implement a version of Universal Serial Bus (USB) protocol or IEEE 1394 (Firewire®) protocol.

Communication adapter 107 may be configured to coordinate data transfer between CPU 101 and one or more devices (e.g., other computer systems) coupled to CPU 101 via a network. In one embodiment, communication adapter 107 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, communication adapter 107 may be configured to implement multiple discrete network interface ports.

User interface adapter 106 may be configured to transfer data between one or more peripheral devices configured to input data into computing system 100. In one embodiment, user interface adapter 106 may receive input from a keyboard and transfer the data to CPU 101. In other embodiments, user interface adapter 106 may receive and format data from a mouse or other suitable pointing device.

Display adapter 104 may be configured to transfer and format data from between CPU 101 and a display screen. In some embodiments, display adapter 104 may be configured to implement a display standard such as Super-VGA or High-Definition Multimedia Interface (HDMI). In other embodiments, display adapter 104 may be configured to implement multiple display interfaces.

The embodiment illustrated in FIG. 1 is merely an example. In other embodiments, different types and numbers of devices are possible and contemplated.

Figure 2:
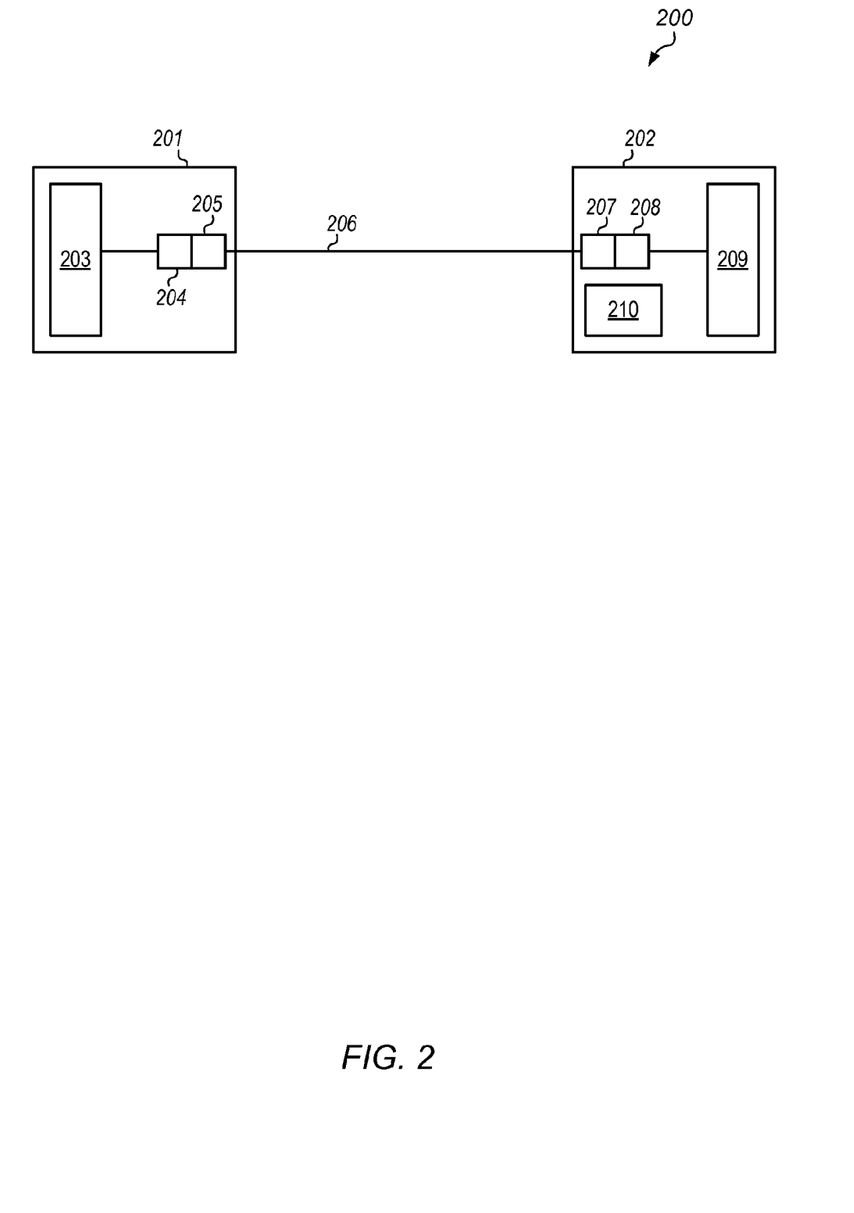
FIG. 2 illustrates another embodiment of a computing system.

Turning to FIG. 2, another embodiment of computing system is illustrated. In the illustrated embodiments, computing system 200 includes device 201 coupled to wire 206, which is, in turn, coupled to device 202. In various embodiments, devices 201 and 202 may correspond to any of the functional blocks described above in referenced to computing system 100 as illustrated in FIG. 1.

Wire 206 may, in various embodiments, include multiple conductive traces on a circuit board, substrate, or any other material suitable for the implementation of a computing system, such as computing system 200, for example. In some embodiments, traces at a constant electrical potential may be inserted between the individual traces included in wire 206. Such traces (commonly referred to as "shields") may, in various embodiments, reduce capacitive and inductive coupling between the individual traces of wire 206, thereby improving the integrity of the signals transmitted on wire 206.

Device 201 includes functional unit 203, which is coupled to encoder unit 204, which is, in turn, coupled to transmit unit 204. In some embodiments, encoder unit 204 may be configured to encode a portion of a serial data stream to be transmitted to device 202 via wire 206. The data may be encoded to introduce data transitions into the data stream in order to improve CDR at the receiving device. Encoder unit 203 may also generate an error correction code for the data. The error correction code may be generated prior to encoding, or may be generated using the encoded data, and may include a Cyclic Redundancy Check (CRC) or any other suitable error checking code. Encoder unit 203 may be designed in accordance with one of numerous design styles. For example, encoder 203 may be a general-purpose processor executing program instructions stored in a memory, a dedicated logic circuit, a memory circuit configured to perform as a look-up table, or any other suitable circuit configured to encode data.

Transmit unit 204 may be configured to translate voltage levels of the encoded data for transmission on wire 206. For example, transmit unit 204 may be configured to transmit data in accordance with the Low-Voltage Transistor-Transistor Logic (LVTTL) standard, or any other suitable voltage levels suitable for signaling from one device to another.

Device 202 includes receive unit 207 which is coupled to wire 206. Receive unit 207 is further coupled to decoder unit 208. Receive unit 207 may be configured to translate voltage levels on wire 206, to a voltage levels used by decoder unit 208. For example, receive circuits 208 and 209 may translate LVTTL voltage levels to Complementary Metal-Oxide Semiconductor (CMOS) voltage levels. Receive unit 207 may also sample the signal on wire 206 using a clock signal generated by clock recovery unit 210. In various embodiments, clock recovery unit 210 may use data transitions detected on wire 206 to extract timing information from the data stream being received via wire 206. Clock recovery unit 210 may use the extracted timing information to generate or adjust a sampling clock. In various embodiments, clock recovery unit 210 may include a phase-locked loop (PLL), delay-locked loop (DLL), or other suitable circuits for generating the sampling clock.

Decoder unit 208 may be configured to decode the encoded portion of the transmission data stream generated by encoder unit 204, and send the complete data stream to functional unit 209. Decoder unit 210 may also analyze an error checking code such as, e.g., a CRC code, generated by encoder unit 204, to determine if errors were introduced during the transmission of the data via wire 206. Decoder unit 208 may, in other embodiments, attempt to correct the errors in cases where a sending device includes an Error Correction Code (ECC).

In some embodiments, decoder unit 208 may be designed in accordance with one of numerous design styles. For example, decoder unit 208 may be a general-purpose processor executing instructions stored in a memory, dedicated logic circuit, a memory device configured to perform as a look-up table, or any other suitable circuit for decoding the received encoded data. In other embodiments, as described below in more detail in regard to FIG. 5, decoder unit 208 may be implemented as a static logic circuit.

It is noted that the embodiment of a computing system illustrated in FIG. 2 is merely an example. In other embodiments, different numbers of busses coupling different numbers of devices may be employed.

Figure 3:
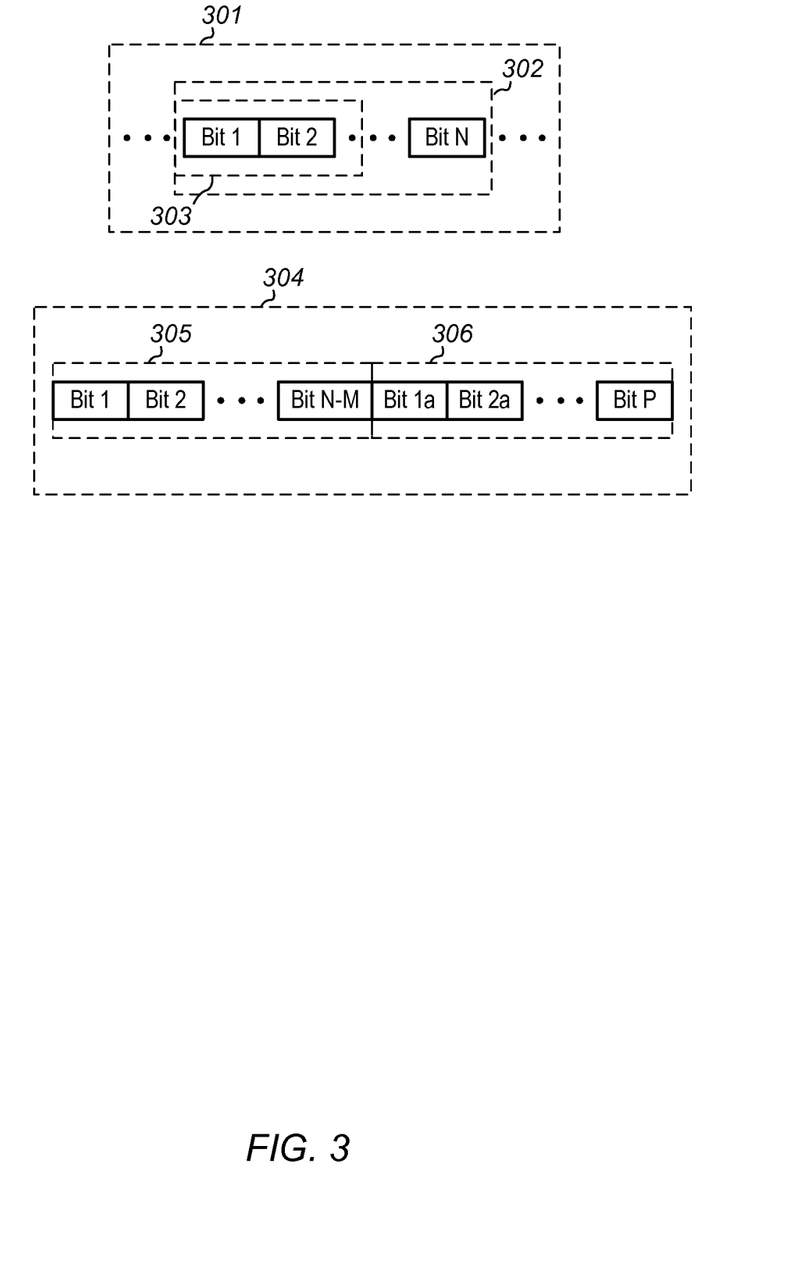
FIG. 3 illustrates a block diagram of a serial data stream.

A block diagram depicting a serial data stream is illustrated in FIG. 3. In the illustrated embodiment, serial data stream 301 may be generated by a functional unit, such as, e.g., functional unit 203 of device 201 as illustrated in FIG. 2. An encoder unit, such as, e.g., encoder unit 204, may select subset 302 of serial data stream 301 on which to operate. Subset 302 includes N data bits, where N is a positive integer and is commonly referred to as the run length. As described below in more detail, N may be adjusted dependent upon various operational parameters of the system. As such, subset 302 may have a variable run length.

The encoder unit may further select code word 303 from subset 302 for encoding. Code word 303 includes M data bits, where M is a positive integer less than N. As such, code word 303 is a proper subset of subset 302. As used and described herein, a proper subset is a subset of a set that is strictly contained in the set and excludes at least one memory of the set. In various embodiments, code word 303 may include any suitable number of bits less than the run length.

Transmission data stream 304 includes two parts, portion 305 and portion 306, and may be transmitted in a serial fashion from one device to another by a transmit unit, such as, transmit unit 205, for example. Portion 305 may include data bits included in subset 302 that are not also included in code word 303. Portion 306 includes an encoded version of code word 303. In some embodiments, portion 306 includes P data bits, where P is a positive integer greater than M and less than N. Each combination of logic values associated with the M data bits of code word 303 may be mapped to a unique combination of logic values in the code space of portion 306 (also referred to herein as a S code space). Each of the available values in the S code space may include both rising and falling transitions from one logic state to another.

Although code word 303 is depicted as including bit 1 of subset 302, in other embodiments, code word 303 may be selected at any suitable point within serial data stream 301. Moreover, the relative order between portions 305 and 306 of transmission data stream 404 may be reversed in various embodiments.

Figure 4:
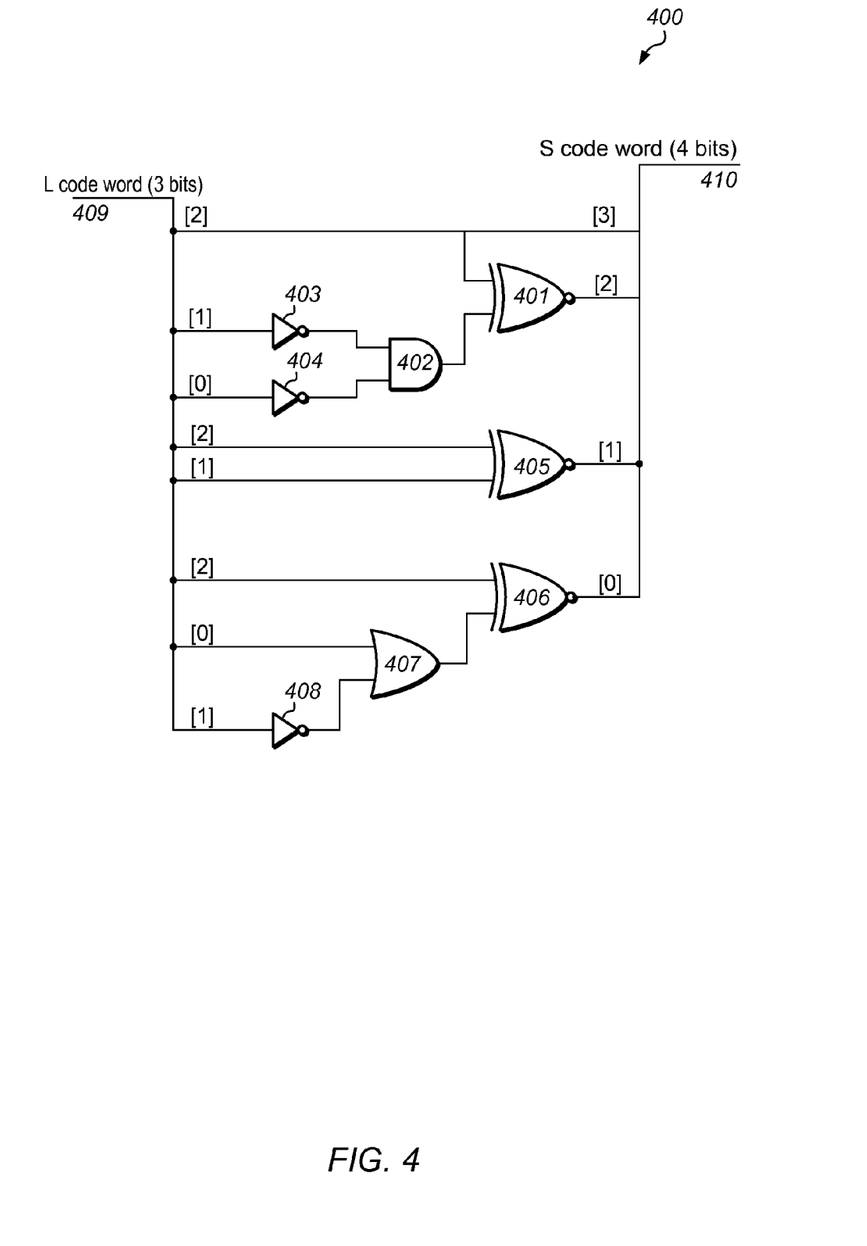
FIG. 4 illustrates an embodiment of an encoding unit.

Turning to FIG. 4, a block diagram of an encoder unit is illustrated. Encoder unit 400 may, in various embodiments, correspond to encoder unit 204 as illustrated in FIG. 2, and may be configured to provide a desired number of data transitions with the resultant encoded data word. In the illustrated embodiments, encoder unit 400 includes inverters 403, 404, and 408, AND gate 402, OR gate 407, and exclusive NOR gates 401, 405, and 406.

Bit 2 of L code word 409 is coupled to bit 3 of S code 410. Bits 1 and 0 of L code word 409 are coupled to the inputs of inverter 403 and 404, respectively. The outputs of inverters 403 and 404 are coupled to the inputs of AND gate 402. The output of AND gate 402 and bit 2 of L code word 409 are coupled to the inputs of exclusive NOR gate 401, whose output is, in turn, coupled to bit 2 of S code word 410.

Bit 2 and bit 1 of L code word 309 are coupled to the inputs of exclusive NOR gate 405, and the output of exclusive NOR gate 305 is coupled to bit 1 of S code word 410. Bit 1 of L code word 409 is coupled to the input of inverter 408. The output of inverter 408 is coupled, along with bit 0 of L code word 409 to the inputs of OR gate 407, whose output is coupled to the inputs of exclusive NOR gate 406, along with bit 2 of L code word 409. The output exclusive OR gate 406 is couple to bit 0 of S code word 410.

During operation, a functional unit of an integrated circuit, such as, e.g., functional unit 203, generates a data stream for transmission to another functional unit or integrated circuit. As described below in more detail, a number of data bits of the data stream are examined. A portion of this number of data bits may then be encoded to create a desired number of data transitions with the number of data bits. Encoder unit 400 then maps the particular value of the portion of data bits to a particular code word in the S code word space. The resultant S code word may then be concatenated with the remaining portion of the number of data bits prior to transmission.

Static complementary metal-oxide-semiconductor (CMOS) inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS.

Static AND, OR, and exclusive NOR gates, such as those shown and described herein may be implemented according to several design styles. Each gate may consist of multiple other logic gates or any suitable combination of metal-oxide semiconductor field-effect transistors (MOSFETs) arranged to implement the desired logic function.

Although encoder unit 400 as illustrated in FIG. 4 is depicted as a static logic circuit, it is noted that, in other embodiments, different types of circuits may be employed. For example, in some embodiments, encoder unit 400 may be implemented as a general-purpose processor configured to execute program instructions or as memory configured as a lookup table.

Figure 5:
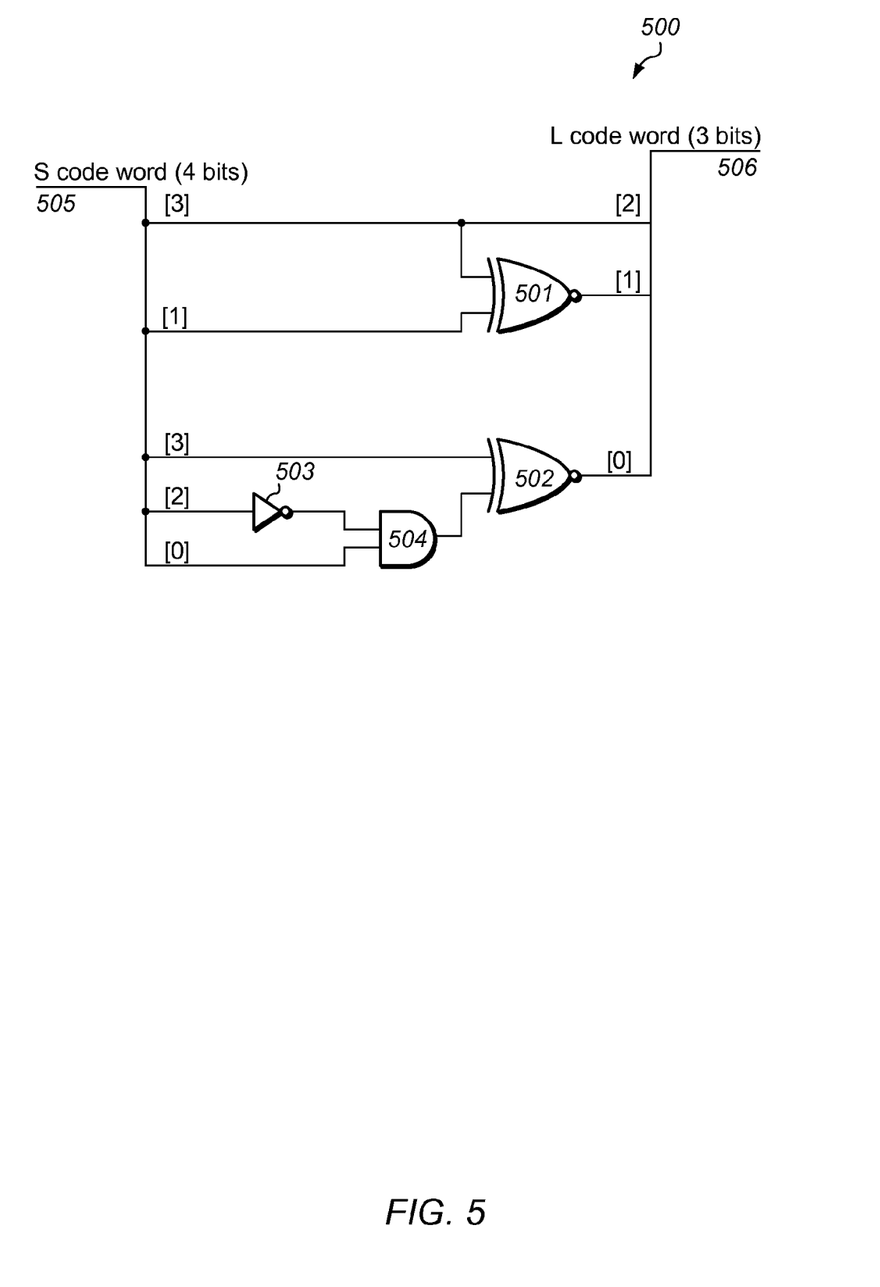
FIG. 5 illustrates an embodiment of a decoding unit.

Once the data stream has been transmitted, the receiving unit may then decode the received serial data bits. An example decoder unit is illustrated in FIG. 5. Decoder unit 500 may, in various embodiments, correspond to decoder unit 208 as illustrated in FIG. 2. In the illustrated embodiment, decoder unit 500 includes inverter 503, AND gate 504, and exclusive NOR gates 501 and 502.

Bit 3 of S code word 505 is coupled to bit 2 of L code word 406. Bits 1 and 3 of S code word 505 are coupled to the inputs of exclusive NOR gate 501, whose output is coupled to bit 1 of S code 506.

Bit 2 of S code word 505 is coupled to inverter 503. The output of inverter 503 is coupled, along with bit 0 of S code word 505, to the inputs of AND gate 504. The output of AND gate 504, and bit 3 of S code word 505, are coupled to the inputs of exclusive NOR gate 502, whose output is coupled to bit 0 of L code word 506.

During operation, a run length of data bits from the received data stream is examined. A portion of the run length of the data bits may then be coupled to the S code word input of decoder unit 500. The portion may, in various embodiments, correspond to the S code word generated by an encoding unit, such as, encoder unit 400, for example. Decoder unit 500 then generates an L code word dependent upon the particular logic values presented on S code word 506. The resultant logic values on L code word 506 are then provided, along with the remaining portion of the run length of data bits, to a functional unit within an integrated circuit, such as, e.g., functional unit 209.

It is noted that the embodiment illustrated in FIG. 5, is merely an example. In other embodiments, different logic gates and different arrangements of logic gates are possible.

Figure 6:
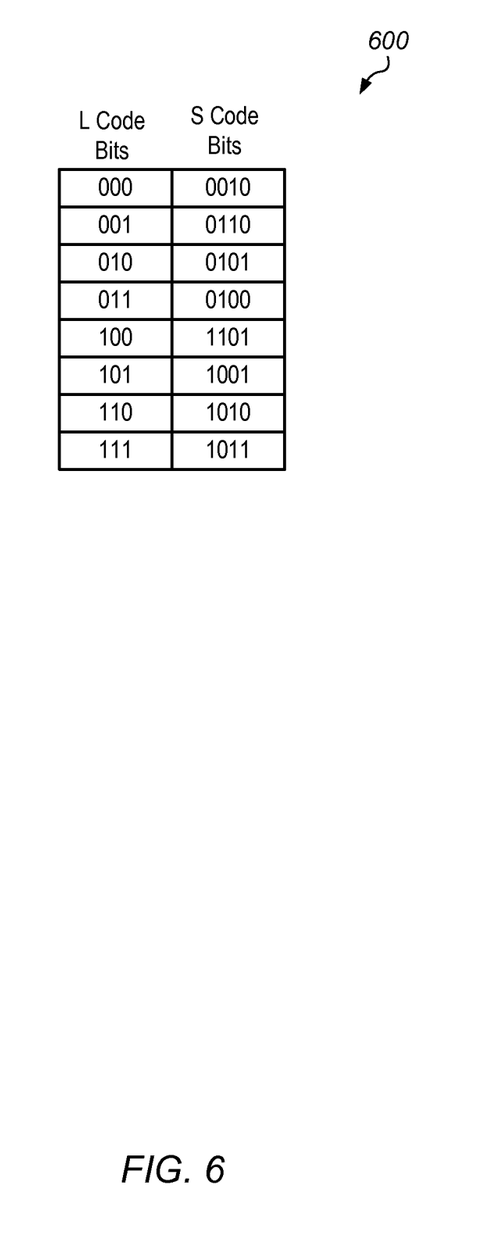
FIG. 6 illustrates a chart depicting an example mapping between codes words in an L-code space to code words in an S-code space.

Turning to FIG. 6, a table illustrating the possible symbols for using three data bits of a sequential signal stream is illustrated. In the first column of table 600, the logical value (or "L code") of the selected data bits is listed, and the in the second column of the table, the equivalent 4 data bit silent code (or "S code") is listed.

In the illustrated embodiment, each of the L code words is mapped to a particular S code word. Each S code word includes a number particular number of logical-1 values. The number of logical-1 values is determined to provide two different transitions within each word as the S code word is transmitted in a serial fashion. For example, the S code value '0010' includes a transition from a low logic state to a high logic state (i.e., a transition from a logical-0 to a logical-1), and a transition from a high logic state to a low logic state (i.e., a transition from a logical-1 to a logical-0). By providing both transition types within a given S code word, a receiver unit has both types of transitions available to perform CDR.

It is noted that although a mapping from L code words consisting of 3 data bits to S code words of 4 data bits is illustrated in the chart of FIG. 6, in other embodiments, different number of data bits in both the L code words and the S code words are possible and contemplated.

In some embodiments, the mapping from L code to S code values may be accomplished by logic circuit such as encoder unit 400 as illustrated in FIG. 4. The mapping at the receiver unit may likewise be performed by a logic circuit, such as, decoder unit 500 as illustrated in FIG. 5, for example. In various other embodiments, any other suitable type of circuit or processing unit may be employed for either the L code to S code mapping, or the S code to L code mapping. For example, in some embodiments, a memory, or other suitable storage circuit, may be used as a lookup table to determine a mapped value.

The chart illustrated in FIG. 6 is merely an example. In other embodiments, a particular L code word may be mapped to a different S code word.

Figure 7:
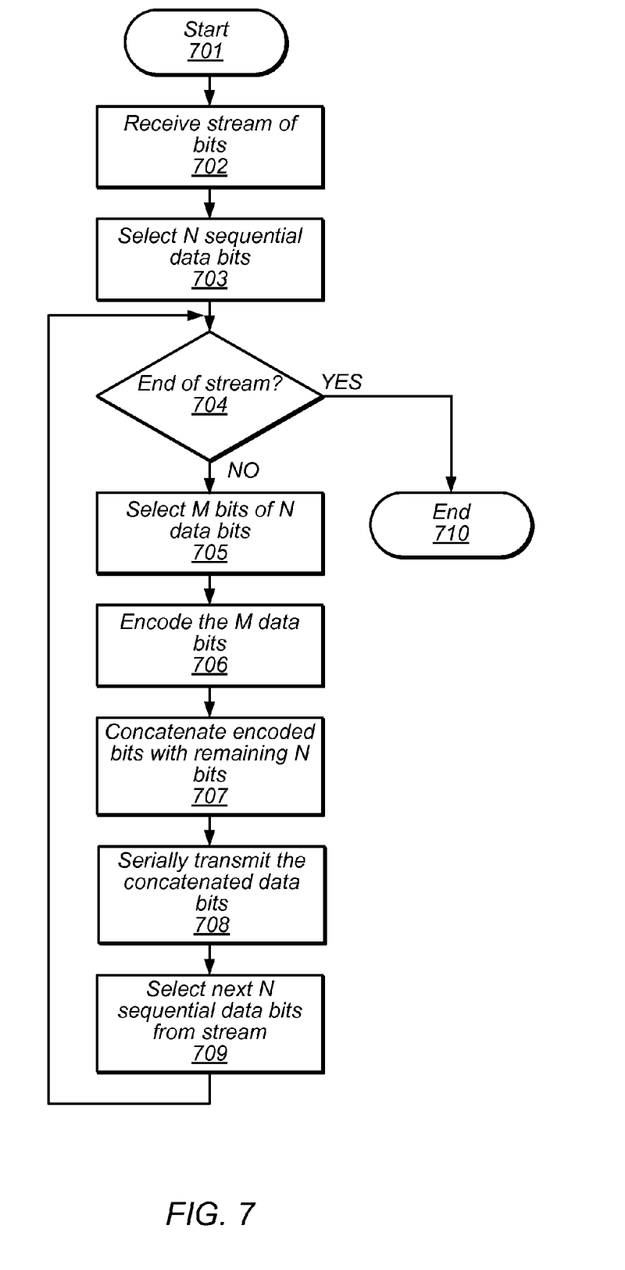
FIG. 7 illustrates a flow diagram depicting an embodiment of a method of operating encoding and transmitting serial data in a computing system.

A flowchart depicting a method of encoding data to reduce SSO noise is illustrated in FIG. 7. Referring collectively to computing system 200 as illustrated in FIG. 2, and the flowchart of FIG. 7, the method begins in block 701. Within device 201, encoder unit 204 may then receive a data stream to be transmitted to device 202 (block 702). In some embodiments, the data received by encoder unit 204 may be from one or more functional blocks within device 201, such as, functional unit 203, for example.

Encoder unit 204 may then examine select N sequential data bits from received data (block 703), where N is a positive integer. In some embodiments, a value of N may be programmable. The value of N may be adjustable based on a number or data bits lost or corrupted during transmission. In other embodiments, the value of N may be selected based on a power supply voltage level, a frequency of a system clock signal, or a frequency of a data transmission.

The method then depends on the data stream (block 704). If the data stream is at an end, then the method concludes in block 610. If, however, the data stream is not at an end, the M data bits of the previously selected N data bits are selected (block 705). In various embodiments, M is a positive integer greater than 1 and less than N. Encoder unit 204 then encodes the selected M data bits (block 706). In some embodiments, a given combination of values of the M data bits is mapped to a particular combination of values of P data bits, where P is a positive integer greater than M and less than N. For example, as illustrated in the table of FIG. 6, three bit values are mapped to four bit values. Each of the values, to which a given combination of the M data bits is mapped, may include a predetermined number of transitions between logic states.

The encoded data bits are then concatenated to the remaining bits of the selected N data bits by encoder unit 204 (block 707). In various embodiments, the encoded data bits may be added in a serial fashion to the end of the remaining N data bits, while, in other embodiments, the encoded data bits may be added in a serial fashion at the start of the remaining N data bits.

With the encoding of the data complete, encoder 204 may then send the encoded data to transmit unit 205, which in turn, serially transmit the encoded data to device 202, via wire 206 (block 708). Transmit circuit 204 may, in various embodiments, convert voltage levels of the concatenated data stream before transmission. In other embodiments, transmit circuit 204 may adjust a bias level of the concatenated data stream prior to transmission. Transmit circuit 204 may send data in accordance with one of various industry standard protocols, such as, PCI Express™, for example.

Once the transmission of the concatenated data stream has begun, a new N data bits may be selected by encoder 204 from the received data stream (block 709). The method may then proceed as described above from block 704.

It is noted that the method illustrated in FIG. 7 is merely an example. In other embodiments, different operations or different orders of operations are possible.

Figure 8:
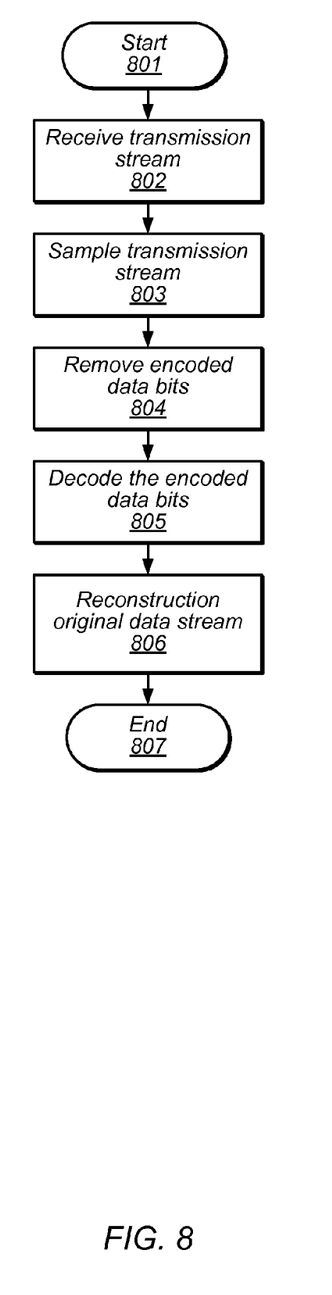
FIG. 8 illustrates a flow diagram depicting an embodiment of a method for receiving a serial data stream.

Turning to FIG. 8, a flow diagram depicting an embodiment of a method for receiving serial data is illustrated. Referring collectively to the block diagram of FIG. 2, and the flow diagram illustrated in FIG. 8, the method begins in block 801.

Device 202 then receives a serial transmission stream (block 802). In various embodiments, the transmission stream may be received from another device, such as, e.g., device 201, for example. The transmission stream may include an encoded data word, such as, encoded data 306 as depicted in FIG. 3.

Receiver unit 207 then samples the transmission stream (block 803). In some embodiments, receiver unit 207 may sample the transmission stream dependent upon a clock signal generated by clock data recovery unit 210. Data transitions, including those added in the encoded data, within the transmission data stream may, in various embodiments, be used to recover timing information from the data stream. The recovered timing information may then be used to generate a sampling clock for the data. Additionally, receiver unit 207 may translate voltage levels as received via wire 206 to voltage levels consistent with logic level inside of device 202. Receiver unit 207 may, in other embodiments, remove and/or modify a DC offset or bias level associated with the received transmission stream.

The encoded data bits may then be removed from the transmission data stream (block 804). In some embodiments, a de-serializer unit may be employed to convert the serial stream of encoded data bits into a collection of parallel data bits that may be further processed. The encoded data bits are then decoded by decoder unit 208 (block 805). In various embodiments, a decoder circuit, such as, e.g., decoder unit 500, may be employed to convert the encoded data bits back into an original logical code space. The decoded data is then combined with the remaining portion of the transmission data stream to reconstruct the originally transmitted data (block 806). The method then concludes in block 807.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a logic circuit;
an encoder circuit configured to:
receive an ordered stream of data bit from the logic circuit;
select N sequential data bits of the ordered stream of data bits, wherein N is a positive integer, and wherein a value of N is programmable;
select M sequential data bits of the N sequential data bits, wherein M is a positive integer less than N;
encode the M sequential data bits to produce an encoded code word, wherein the encoded code word includes P data bits, wherein P is a positive integer greater than M and less than N;
concatenate the encoded code word with a proper subset of the N sequential data bits to generate a transmission data word, wherein the proper subset of the N sequential data bits excludes the M sequential data bits; and
a transmit unit configured to serially transmit the transmission data word.

2. The apparatus of claim 1, wherein the encoded code word includes a first data bit at a first bit location in the encoded code word and a second data bit at a second bit location in the encoded code word, wherein the second bit location is adjacent to the first bit location, and a first logic value of the first data bit is different from a second logic value of the second data bit, and wherein the encoded code word includes a third data bit at a third bit location in the encoded code word, wherein a third logic value of the third data bit is the same as the first logic value.

3. The apparatus of claim 1, wherein the transmit unit is further configured to determine a quality level of transmission of the transmission data word.

4. The apparatus of claim 3, wherein the encoder circuit is further configured to adjust a value of N dependent upon the quality level.

5. The apparatus of claim 1, wherein N is greater than three, and M is three less than N, and P is one greater than M.

6. A method for operating a computing system, comprising:
receiving an ordered stream of data bits;
selecting N sequential data bits of the ordered stream of data bits, wherein N is a positive integer, and wherein a value of N is programmable;
selecting M sequential data bits of the N sequential data bits, wherein M is a positive integer less than N;
encoding the M sequential data bits to produce an encoded code word, wherein the encoded code word includes P data bits, wherein P is a positive integer greater than one, greater than M, and less than N;
concatenating the encoded code word with a proper subset of the N sequential data bits to generate a transmission data word, wherein the proper subset of the N sequential data bits excludes the M sequential data bits; and
serially sending each data bit of the transmission data word.

7. The method of claim 6, further comprising determining a quality level of the sending of each data bit of the transmission data word.

8. The method of claim 7, further comprising, modifying a value of N dependent upon the quality level.

9. The method of claim 7, wherein determining the quality level includes determining a number of data transmission failures.

10. The method of claim 6, further comprising:
receiving the transmission data word; and
decoding the encoded code word.

11. The method of claim 6, wherein the encoded code word includes a first data bit at a first bit location in the encoded code word and a second data bit at a second bit location in the encoded code word, wherein the second bit location is adjacent to the first bit location, and a first logic value of the first data bit is different from a second logic value of the second data bit, and wherein the encoded code word includes a third data bit at a third bit location in the encoded code word, wherein a third logic value of the third data bit is the same as the first logic value.

12. The method of claim 6, wherein N is greater than three, and M is three less than N, and P is one greater than M.

13. A system, comprising:
a first device; and
a second device coupled to the first device via a communication link, wherein the second device is configured to:
    select N sequential data bits of an ordered stream of data bits, wherein N is a positive integer, and wherein a value of N is programmable;
    select M sequential data bits of the N sequential data bits, wherein M is a positive integer less than N;
    encode the M sequential data bits to produce an encoded code word, wherein the encoded code word includes P data bits, wherein P is a positive integer greater than one, greater than M, and less than N;
    concatenate the encoded code word with a proper subset of the N sequential data bits to generate a transmission data word, wherein the proper subset of the N sequential data bits excludes the M sequential data bits; and
    serially send each data bit of the transmission data word via the communication link to the first device.

14. The system of claim 13, wherein the encoded code word includes a first data bit at a first bit location in the encoded code word and a second data bit at a second bit location in the encoded code word, wherein the second bit location is adjacent to the first bit location, and a first logic value of the first data bit is different from a second logic value of the second data bit, and wherein the encoded code word includes a third data bit at a third bit location in the encoded code word, wherein a third logic value of the third data bit is the same as the first logic value.

15. The system of claim 13, wherein the second device is further configured to determine a quality level of the communication link.

16. The system of claim 15, wherein the second device is further configured to adjust a value of N dependent upon the quality level.

17. The system of claim 13, wherein N is greater than three, and M is three less than N, and P is one greater than M.

18. The system of claim 13, wherein the first device includes circuitry configured to perform clock data recovery (CDR) dependent upon the transmission data word.

* * * * *